(12) United States Patent
Oesterle et al.

(10) Patent No.: US 9,748,465 B2
(45) Date of Patent: Aug. 29, 2017

(54) THERMOELECTRIC MODULE, HEAT EXCHANGER, EXHAUST SYSTEM AND INTERNAL COMBUSTION ENGINE

(71) Applicant: Eberspächer Exhaust Technology GmbH & Co. KG, Neunkirchen (DE)

(72) Inventors: Jörg Oesterle, Laichingen (DE); Arnulf Spieth, Hochdorf (DE); Andreas Resch, Esslingen (DE); Herve Tchamgoue, Esslingen (DE); Sebastian Leicht, Bisingen (DE)

(73) Assignee: EBERSPAECHER EXHAUST TECHNOLOGY GMBH & CO. KG, Neunkirchen (DE)

( * ) Notice: Subject to any disclaimer, the term of this patent is extended or adjusted under 35 U.S.C. 154(b) by 736 days.

(21) Appl. No.: 13/923,615

(22) Filed: Jun. 21, 2013

(65) Prior Publication Data
US 2014/0000670 A1 Jan. 2, 2014

(30) Foreign Application Priority Data
Jun. 22, 2012 (DE) .......................... 10 2012 210 627

(51) Int. Cl.
*H01L 35/32* (2006.01)
*H01L 35/04* (2006.01)

(52) U.S. Cl.
CPC .............. *H01L 35/32* (2013.01); *H01L 35/04* (2013.01)

(58) Field of Classification Search
CPC ................................ H01L 35/32; H01L 35/04
See application file for complete search history.

(56) References Cited

U.S. PATENT DOCUMENTS

| 3,582,616 A | * | 6/1971 | Wrob | ............... H05B 3/48 |
| | | | | 219/541 |
| 4,459,428 A | * | 7/1984 | Chou | ............... H01L 35/32 |
| | | | | 136/201 |
| 5,837,929 A | | 11/1998 | Adelman | |
| 2011/0252774 A1 | | 10/2011 | Spieth et al. | |
| 2011/0275165 A1 | | 11/2011 | Suzuki et al. | |

(Continued)

FOREIGN PATENT DOCUMENTS

| DE | 1 92 66 45 A1 | 11/1970 |
| DE | 4 00 68 61 A1 | 9/1991 |

(Continued)

*Primary Examiner* — Shannon Gardner
(74) *Attorney, Agent, or Firm* — McGlew and Tuttle, P.C.

(57) ABSTRACT

A thermoelectric module (13), for converting thermal energy into electric energy, includes a plurality of leg pairs (26), which have each a p-doped semiconductor leg (27) and an n-doped semiconductor leg (28), which are contacted with one another electrically via metal bridges (29). At least one electrically insulating ceramic plate (30), which is arranged on a hot side (18) of the thermoelectric module (13) or on a cold side (19) of the thermoelectric module (13) and is flatly in contact with metal bridges (29) associated with this side (18, 19) and is fastened thereto. The pressure stability of the thermoelectric module (13) can be improved if the respective ceramic plate (30) is segmented, so that a plurality of ceramic plate segments (31) are arranged next to each other, which are each flatly in contact with a plurality of metal bridges (29) and are fastened thereto.

20 Claims, 3 Drawing Sheets

(56) References Cited

U.S. PATENT DOCUMENTS

2011/0311421 A1* 12/2011 Backhaus-Ricoult B01D 53/9477
423/213.2
2012/0000901 A1 1/2012 Bajic et al.

FOREIGN PATENT DOCUMENTS

| | | |
|---|---|---|
| DE | 10 2007 060 312 A1 | 2/2009 |
| DE | 10 2010 015 321 A1 | 10/2011 |
| DE | 10 2010 063460 B3 | 4/2012 |
| JP | H09-321353 A | 12/1997 |
| JP | 2003-174203 A | 6/2003 |
| JP | 2006-237146 A | 9/2006 |
| JP | 2008-072775 A | 3/2008 |
| JP | 2008-244100 A | 10/2008 |
| WO | 2010/014958 A2 | 2/2010 |

* cited by examiner

THERMOELECTRIC MODULE, HEAT EXCHANGER, EXHAUST SYSTEM AND INTERNAL COMBUSTION ENGINE

CROSS REFERENCE TO RELATED APPLICATIONS

This application claims the benefit of priority under 35 U.S.C. §119 of German Patent Application DE 10 2012 210 627.8 filed Jun. 22, 2012, the entire contents of which are incorporated herein by reference.

FIELD OF THE INVENTION

The present invention pertains to a thermoelectric module for converting thermal energy into electric energy. The present invention pertains, moreover, to a heat exchanger equipped with at least one such thermoelectric module. The present invention pertains, furthermore, to an exhaust system as well as to an internal combustion engine, which are equipped with such a heat exchanger.

BACKGROUND OF THE INVENTION

A thermoelectric module can convert a heat flow into an electric current by utilizing the so-called Seebeck effect. The Seebeck effect is based on an inversion of the Peltier effect. Such thermoelectric modules can therefore be used to recover heat or to generate electric energy from heat and can be correspondingly used in exhaust systems of internal combustion engines, preferably in motor vehicles, in order to improve the energy efficiency of the internal combustion engine or of the vehicle.

A thermoelectric module specifically comprises usually a plurality of leg pairs, which have each a p-doped semiconductor leg and an n-doped semiconductor leg, wherein the semiconductor legs are in contact with one another electrically via metal bridges. The leg pairs may hereinafter also be called LEG pairs. Conversion of thermal energy into electric energy takes place in every individual LEG pair. The plurality of LEG pairs are connected, furthermore, within the respective thermoelectric module, preferably in series, such that the respective thermoelectric module advantageously has only one positive pole and only one negative pole, at which the electric energy can be tapped. The LEG pairs may be connected especially via the metal bridges.

A thermoelectric module has, furthermore, a hot side and a cold side, at which the temperature difference is to be applied in order to generate a heat flow by the thermoelectric module, which said heat flow can be converted therein into electric current. The cold side and the hot side are usually formed on such a thermoelectric module by an electrically insulating ceramic plate, with which the metal bridges are flatly in contact (or have surface contact) and to which they are fastened.

To couple within a heat exchanger a heating tube, which carries a heating fluid, for example, exhaust gas of an exhaust system, as well as a cooling tube, which carries a cooling fluid, for example, a coolant of a cooling circuit, with the hot side and with the cold side, respectively, of such a thermoelectric generator or module in a heat-transferring manner, a prestress, which presses the respective tube against the thermoelectric module, is usually generated to improve the heat transfer.

Since the ceramic plates of the thermoelectric module have a high flexural rigidity and are comparatively brittle, close manufacturing tolerances must be maintained in order to avoid pressure peaks and hence force peaks at the ceramic plates. The effort needed for this during the manufacture of the heat exchangers is comparatively great.

SUMMARY OF THE INVENTION

The present invention pertains to an object of providing an improved embodiment, which is characterized especially by reduced susceptibility to a pressure load, for a thermoelectric module of the type mentioned in the introduction or for a heat exchanger equipped therewith or for an exhaust system equipped therewith or for an internal combustion engine equipped therewith.

According to the invention, a thermoelectric module is provided for converting thermal energy into electric energy. The thermoelectric module comprises a plurality of leg pairs, each leg pair comprising a p-doped semiconductor leg and an n-doped semiconductor leg and metal bridges contacting the p-doped semiconductor leg and the n-doped semiconductor leg such that the p-doped semiconductor leg and the n-doped semiconductor leg are electrically in contact. An electrically insulating ceramic plate is arranged on a hot side of the thermoelectric module or on a cold side of the thermoelectric module. The electrically insulating ceramic plate is in surface contact with the metal bridges associated with the side and is fastened thereto. The ceramic plate is segmented to provide a plurality of ceramic plate segments arranged next to each other. The ceramic plate segments are in flat surface contact with the plurality of metal bridges and are fastened thereto.

The present invention is based on the general idea of segmenting the respective ceramic plate. The segmenting of the ceramic plate is carried out in this case such that a plurality of ceramic plate segments are arranged as a result aligned with one another with their surfaces next to each other. The segmenting advantageously takes place such that the ceramic plate segments are each flatly in contact with a plurality of metal bridges and are fastened to a plurality of metal bridges. The individual ceramic plate segments can move relative to one another due to the segmenting of the ceramic plate, as a result of which pressure peaks can be reduced. If the ceramic plate is flat, the ceramic plate segments are arranged next to each other in the plane of the ceramic plate. If the ceramic plate is curved, the ceramic plate segments are arranged next to each other corresponding to the curvature of the ceramic plate.

In one embodiment, the ceramic plate segments may abut against each other, so that they are in contact with one another at a respective butt joint. This results in an especially simple design of the respective module. The ceramic plate segments are in contact with one another in the respective butt joint via abutting edges. The respective abutting edge may be rounded at least in one ceramic plate segment in order to reduce the risk of damage during relative motions of the ceramic plate segments abutting against each other.

Especially advantageous is a variant in which a joint each is formed between ceramic plate segments that are adjacent to one another in the flat extension of the ceramic plate, such that adjacent ceramic plate segments do not touch each other. This means that the individual ceramic plate segments are arranged without being in contact with one another, so that relative motions of the ceramic plate segments in relation to one another do not, in particular, bring about any wear due to friction of the ceramic plate segments with one another. The ceramic plate segments can move more freely relative to one another due to the joints. The respective joint may be made comparatively narrow. In particular, a joint width may be smaller than the thickness of the ceramic plate.

Corresponding to an advantageous embodiment, the respective joint may be sealed gas-tightly with an elastic jointing compound. The semiconductor legs, which are arranged between the ceramic plates, have a comparatively high susceptibility to oxygen. For example, ambient air can be prevented from reaching the semiconductor legs through the joints due to gas-tight sealing of the joints. The mobility of the ceramic plate segments in relation to one another can be preserved due to the elasticity of the jointing compound.

According to an advantageous variant, a heat-conducting adhesive, which is also used to fasten the ceramic plate segments to the metal bridges, may be used as a jointing compound. The manufacture of the thermoelectric modules can be simplified hereby, because, for example, the filling of the joints and the bonding of the ceramic plate segments with the metal bridges can be performed simultaneously.

As an alternative, a pourable sealing compound, with which the intermediate spaces of adjacent semiconductor legs within the respective thermoelectric module are also filled, may also be used as a jointing compound. This measure also makes possible a simple manufacture of the thermoelectric modules, because the filling of the intermediate spaces by pouring and the filling of the joints can be carried out simultaneously.

The ceramic plate segments may be arranged specifically such in an advantageous embodiment that the butt joints and the joints extend largely to gaps, which are formed on this side between adjacent metal bridges. This embodiment leads to an especially great mobility of adjacent ceramic plate segments in relation to one another.

In another advantageous embodiment, the LEG pairs may be arranged regularly within the thermoelectric module, such that a rectangular grid structure is obtained for the metal bridges. The ceramic plate segments advantageously have a rectangular shape in such an embodiment. The ceramic plate segments can be formed and arranged in this manner, in particular, especially simply such that the joints extend congruently to the gaps between adjacent metal bridges.

Provisions may be made in another advantageous embodiment for such a segmented ceramic plate each to be arranged on both the hot side and the cold side. The respective thermoelectric module will have an especially high flexibility and elasticity against pressure loads due to this measure. The two ceramic plates on the hot side and on the cold side are preferably segmented differently, such that different joint shapes, which prevent congruent joints, are obtained.

At least one heating tube for carrying a heating fluid and at least one cooling tube for carrying a cooling fluid are provided in a heat exchanger according to the present invention. Furthermore, at least one thermoelectric module of the type described above is provided, which is arranged in a stacking direction between the heating tube and the cooling tube, so that the hot side of the thermoelectric module faces the heating tube, while the cold side of the thermoelectric module faces the cooling tube.

Unevennesses of the tube surfaces may lead to pressure peaks on the ceramic plates in a stack in which heating tubes, cooling tubes and thermoelectric modules are stacked up on one another. These pressure peaks may generate relative motions between the ceramic plate segments due to the segmenting of the ceramic plates, as a result of which the risk of destruction of or damage to the ceramic plate is reduced.

According to an advantageous embodiment of the heat exchanger, an elastic heat-conducting layer, e.g., a graphite foil, may be arranged in the stacking direction between the cooling tube and the ceramic plate arranged on the cold side. The contact between the thermoelectric module and the respective tube is not brought about directly, but indirectly via the respective heat-conducting layer in such an embodiment. Such an elastic heat-conducting layer, e.g., a graphite foil, is elastic, on the one hand, and has, on the other hand, increased thermal conductivity, as a result of which the heat transfer between the respective ceramic plate and the respective tube can be improved. At the same time, the elastic heat-conducting layer can compensate surface unevennesses of the respective tube and possibly of the respective ceramic plate due to elastic and/or plastic deformation.

Corresponding to another embodiment of the heat exchanger, the tubes and the respective thermoelectric module may be braced in the stacking direction. This bracing may be brought about by means of a housing, in which a corresponding prestressing force is generated during the closing of the housing. It is equally possible to equip the heat exchanger with a prestressing means, which introduces the prestressing force onto the stack from the tubes and from the respective thermoelectric module. For example, such a prestressing means may have two end plates, which are arranged on both sides of the stack in relation to the stacking direction, so that the stack is located between the two end plates. Furthermore, the end plates are braced with one another by means of tension rods in order to make it possible to introduce the desired prestress into the stack via the end plates.

According to another advantageous embodiment of the heat exchanger, a plurality of heating tubes and a plurality of cooling tubes as well as a plurality of thermoelectric modules may be stacked alternatingly with one another in the stacking direction.

An exhaust system according to the present invention, which may be used in an internal combustion engine, preferably in a motor vehicle, comprises an exhaust pipe, into which a heat exchanger of the above-described type is integrated, so that exhaust gas being carried in the exhaust pipe flows through at least one heating tube of the heat exchanger and thus acts as a heating fluid.

An internal combustion engine according to the present invention, which is used especially in a motor vehicle, comprises an engine block, which contains a plurality of combustion chambers, an exhaust system for removing exhaust gas from the combustion chambers as well as a heat exchanger of the above-described type, which is integrated in the exhaust system and in a cooling circuit such that the exhaust gas flows through the at least one heating tube and the coolant of the cooling circuit flows through the at least one cooling tube.

The cooling circuit may be a cooling circuit for cooling the engine block, i.e., an engine cooling circuit. As an alternative, the cooling circuit may also be a cooling circuit that is independent from the engine cooling circuit and is operated especially at a different temperature level than the engine cooling circuit.

It is apparent that the above-described features, which will also be explained below, may be used not only in the respective combination described, but in other combinations or alone as well, without going beyond the scope of the present invention.

Preferred embodiments of the present invention are shown in the drawings and will be explained in more detail in the following description, wherein identical or similar functionally identical components are designated by the same reference numbers. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
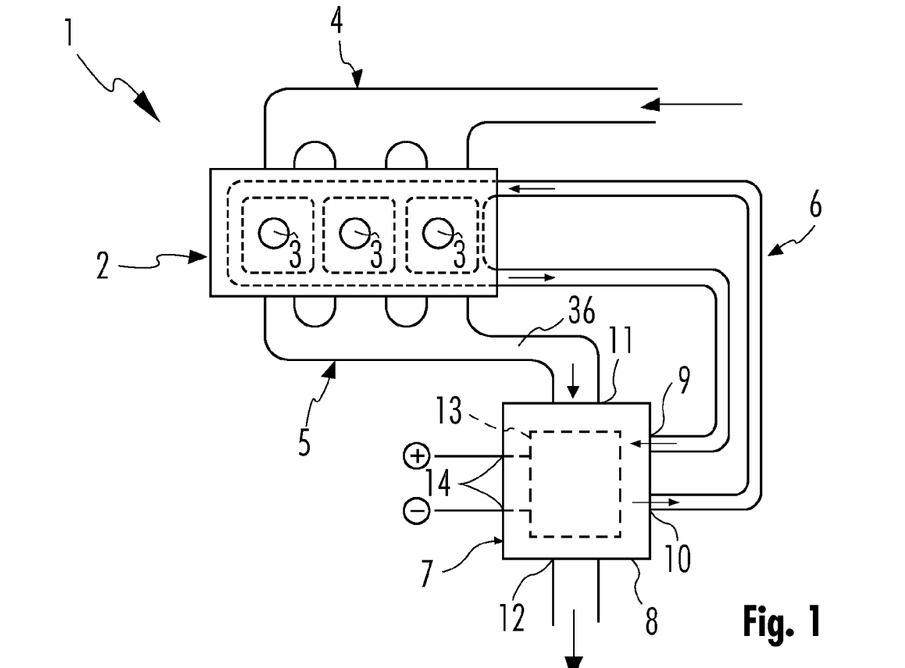
FIG. 1 is a highly simplified block diagram-like general view of an internal combustion engine according to the invention.

Referring to the drawings in particular, corresponding to FIG. 1, an internal combustion engine 1, which is preferably used in a motor vehicle, comprises an engine block 2, which contains a plurality of combustion chambers 3, a fresh air supply unit 4 for supplying the combustion chambers 3 with fresh air, and an exhaust system 5 for removing exhaust gas from the combustion chambers 3. Furthermore, the internal combustion engine 1 is equipped with a cooling circuit 6, by means of which the engine block 2 can be cooled. It is clear that a cooler, not shown here, optionally in connection with a blower, may be provided in the cooling circuit 6 in order to be able to correspondingly cool the coolant being carried in the cooling circuit 6. The cooling circuit 6 used to cool the engine block 2 may also be called an engine cooling circuit or a primary cooling circuit. In addition to this primary cooling circuit 6, a separate cooling circuit, not shown here, which may also be called a secondary cooling circuit and which may have especially a cooler of its own, optionally a blower of its own, and a separate coolant, may be optionally provided as well. The secondary cooling circuit may be operated especially at a different temperature level than the primary cooling circuit 6.

The internal combustion engine 1 is equipped, in addition, with a heat exchanger 7, whose housing 8 has a coolant inlet 9, a coolant outlet 10, a heating agent inlet 11 and a heating agent outlet 12. The heat exchanger 7 is fluidically integrated in the exhaust system 5 or in an exhaust pipe 36 of the exhaust system 5 via its heating agent inlet 11 and its heating agent outlet 12, the exhaust gas being used in the heat exchanger 7 as a heating agent or heating fluid. Furthermore, the heat exchanger 7 is integrated via its coolant inlet 9 and its coolant outlet 10 in the cooling circuit 6, whose coolant is used as a coolant or cooling fluid in the heat exchanger 7 as well. The heat exchanger 7 is thus integrated in the primary cooling circuit in the example being shown. The heat exchanger 7 may also be integrated in the above-mentioned secondary cooling circuit in an alternative embodiment.

The heat exchanger 7 contains, moreover, at least one thermoelectric module 13, which is coupled in the interior of the heat exchanger 7 with the heating fluid and with the cooling fluid in a heat-transferring manner. Electric terminals 14, which are correspondingly connected electrically to the respective thermoelectric module 13, are formed on the housing 18.

Figure 2:
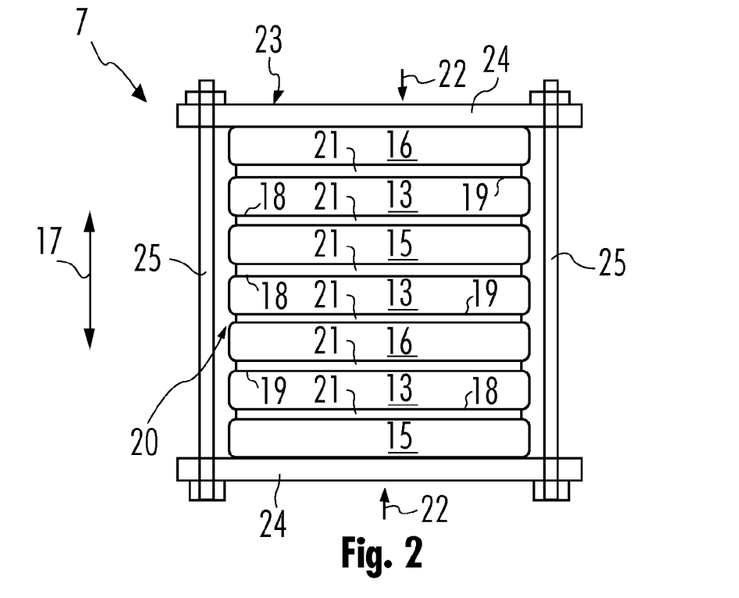
FIG. 2 is a highly simplified cross sectional view of a heat exchanger.

Corresponding to FIG. 2, the heat exchanger 7 comprises a plurality of heating tubes 15 for carrying the heating fluid, a plurality of cooling tubes 16 for carrying the cooling fluid and a plurality of thermoelectric modules 13, which are each arranged between a heating tube 15 and a cooling tube 16 in a stacking direction 17. The respective thermoelectric module 13 has a hot side 18 and a cold side 19, which face away from each other in the stacking direction 18. The arrangement of the thermoelectric modules 13 and of the heating tubes 15 as well as of the cooling tubes 16 forms a stack 120, in which the respective hot side 18 faces a heating tube 15 and in which the respective cold side 19 faces a cooling tube 16. In addition, a heat-conducting layer 21, which is preferably a graphite foil, which can hereinafter likewise be designated by 21, is arranged in the stacking direction 17 between the respective thermoelectric module 13 and the respective tube 15, 16 in the example according to FIG. 2.

Only one such thermoelectric module 13 can be seen in an intermediate space not designated more specifically, which is located in the stacking direction 17 between two adjacent tubes 15, 16 in the view shown in FIG. 2. It is clear that a plurality of such thermoelectric modules 13 may also be arranged one after another in the respective intermediate space in a longitudinal direction of the stack 20, which direction is at right angles to the drawing plane.

The stack 20 is braced in the stacking direction 17 corresponding to arrows 22, as a result of which the tubes 15, 16 are supported in the braced state on the respective thermoelectric generator 13 via the graphite foil in the stacking direction 17. The prestressing force 22 is generated in the example according to FIG. 1 by means of a prestressing means 23, which may be arranged in the housing 8 of the heat exchanger 7 or may be formed by the housing 8 of the heat exchanger 7 itself. In the example according to FIG. 2, the prestressing means 23 comprises two end plates 24, which are arranged on both sides of the stack 20 in the stacking direction 17 and accommodate the stack 20 between them in the stacking direction 17. The end plates 24 are in contact each with the respective outermost tube 15 and 16 of the stack 20. Furthermore, the end plates 24 are braced with one another by means of tension rods 25, as a result of which the prestressing force 22 oriented in the stacking direction 17 is generated and is transmitted to the stack 20.

Figure 3:
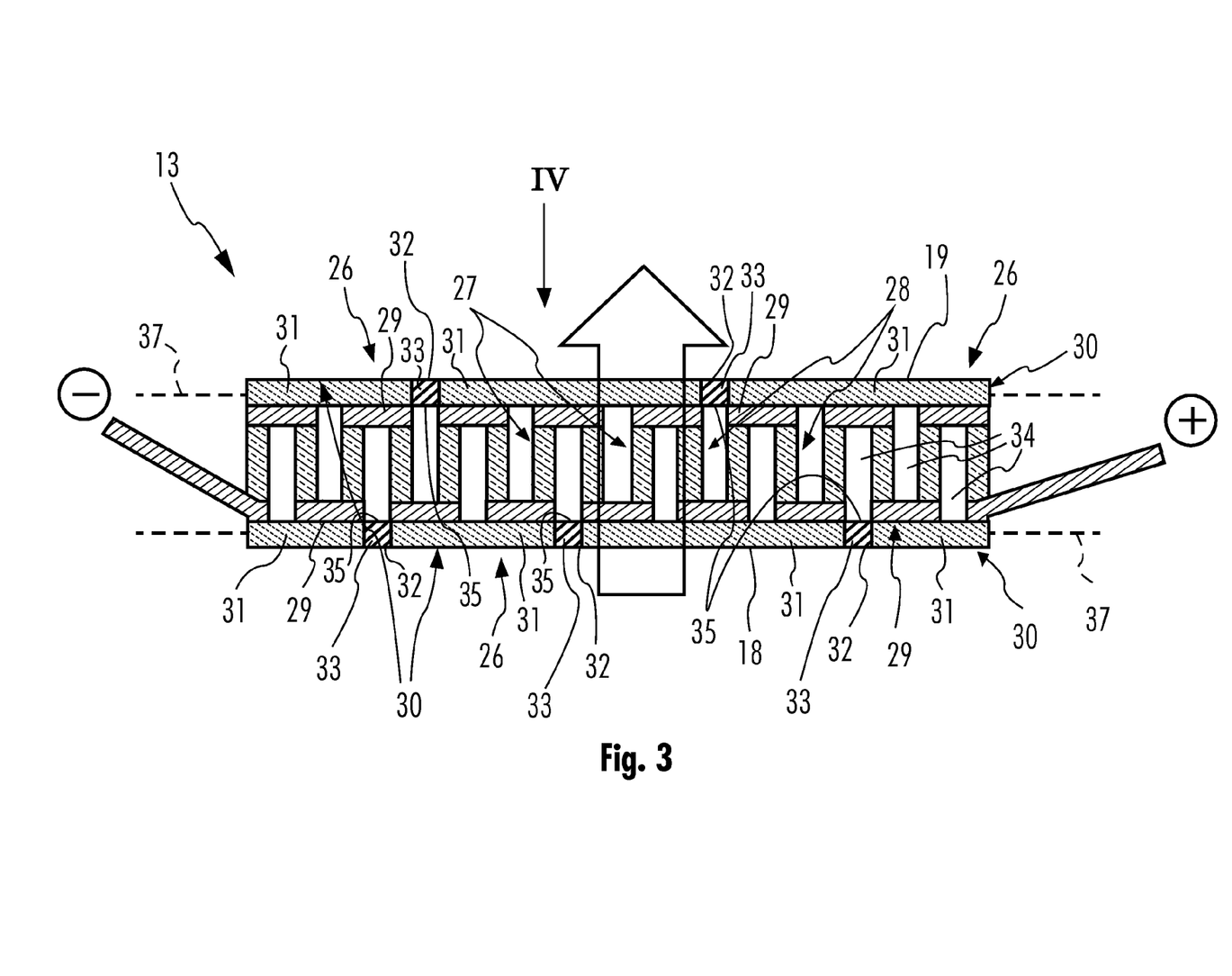
FIG. 3 is a highly simplified cross sectional view of a thermoelectric module.
Figure 4:
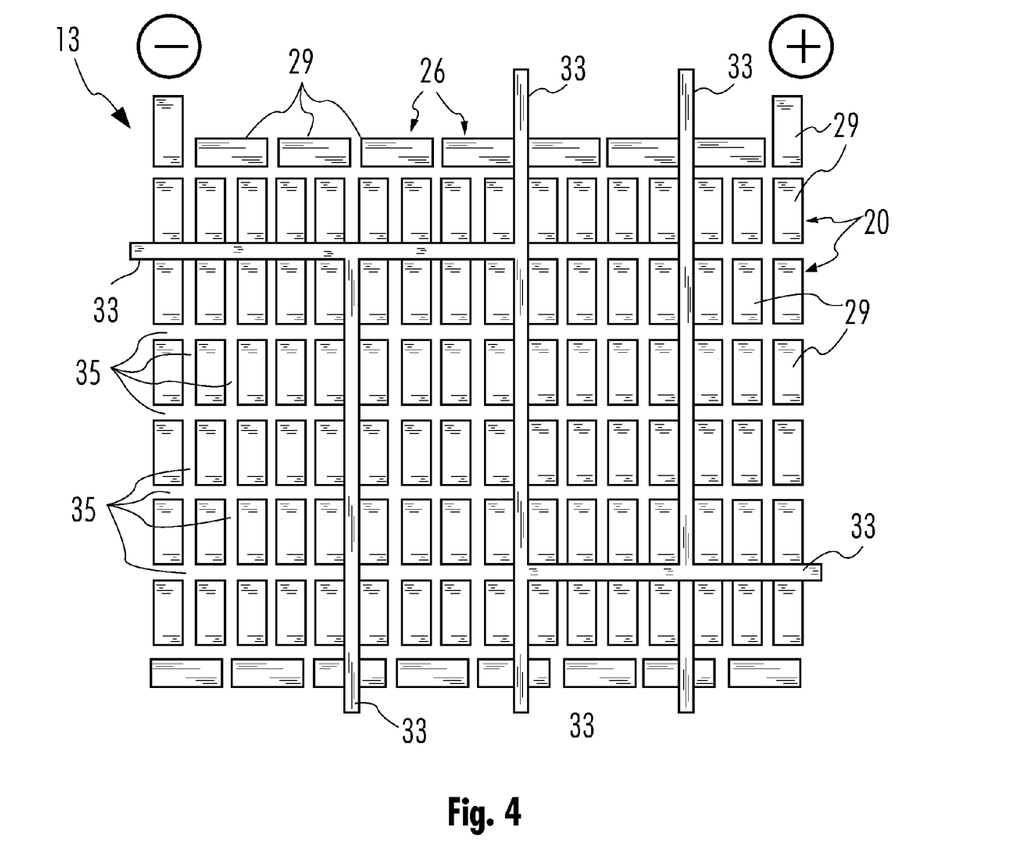
FIG. 4 is a simplified top view of the thermoelectric module corresponding to a direction of view IV in FIG. 3.

According to FIGS. 3 and 4, the respective thermoelectric module 13 comprises a plurality of leg pairs 26 or LEG pairs 26. Each LEG pair 26 has a p-doped semiconductor leg 27 and an n-doped semiconductor leg 28, which are contacted with one another electrically via metal bridges 29.

Furthermore, a ceramic plate 30 each, which is electrically insulating, is arranged on both the hot side 18 and on the cold side 19. The metal bridges 29 are flatly in contact or have surface contact with the respective ceramic plate 30. Furthermore, the metal bridges 29 are fastened to the respective ceramic plate 30. A corresponding adhesive, which is characterized especially by an especially high thermal conductivity and may correspondingly also be called heat-conducting adhesive, may be used for this. The use of a connection in substance, especially a soldered connection, for example, by means of an active solder, is also conceivable, in principle, instead of an adhesive-based connection. The ceramic plates 30 have a flat design in the example being shown and extend, at least in the unobstructed state of the respective thermoelectric module 13, in a plate plane 37.

Curved ceramic plates 30, which extend in or along or corresponding to a curvature of the plate, are also conceivable, in principle.

The respective ceramic plate 30 is segmented, so that the respective ceramic plate 30 comprises a plurality of ceramic plate segments 31, which are arranged next to each other in the plate plane 37 of the respective ceramic plate 30 or according to the curvature of the plate. Three ceramic plate segments 31 can be seen in the example shown in FIG. 3 in the selected section plane on the cold side 19, i.e., at the top, whereas four ceramic plate segments 31 can be seen at the bottom, i.e., on the hot side 18. The segmenting of the respective ceramic plate 30 is advantageously performed such that a plurality of metal bridges 29 are flatly in contact with each respective ceramic plate segment 31 and are fastened thereto. Furthermore, a joint 31, which ensures that the adjacent ceramic plate segments 31 do not touch each other, are formed between ceramic plate segments 31 that are adjacent to each other in the plate plane 37 in the examples being shown here. The respective joint 32 is advantageously sealed in a gas-tight manner with a preferably elastic jointing compound 33. For example, the above-mentioned heat-conducting adhesive, which is also used to fasten the metal bridges 29 to the ceramic plate segments 31, is used as the jointing compound 33. As an alternative, a pourable sealing compound, with which the intermediate spaces 34 of adjacent semiconductor legs 27, 28 within the respective thermoelectric module 13 are filled, may also be used as the jointing compound. The pourable sealing compound is not shown in the sectional view in FIG. 3.

Provisions may be made in another embodiment for the adjacent ceramic plate segments 31 to abut against each other and to correspondingly touch each other along a butt joint each. In the respective butt joint, the respective ceramic plate segment 31 has an abutting edge, which is in contact with an abutting edge of the adjacent ceramic plate segment 31 in the respective butt joint. At least one of the abutting edges may be rounded. Both abutting edges are preferably rounded in the respective butt joint.

The ceramic plates 30 are omitted in the view shown in FIG. 4. In addition, only the metal bridges 29 of the cold side 19 can be seen. Furthermore, the jointing compound 33 is indicated in order to illustrate the course of the joints 32 and of the butt joints between adjacent ceramic plate segments 31 of the ceramic plate 30 that is associated with the cold side 19. As can be seen, this ceramic plate 30 is segmented such that the ceramic plate segments 31 can be specifically arranged such that the joints 32 and the butt joints, whose course in FIG. 4 corresponds to the course of the jointing compound 33, extend congruently to gaps 35, which are present on the cold side 19 between adjacent metal bridges 29. This special arrangement of the ceramic plate segments 31 can also be seen in the sectional view shown in FIG. 3. The joints 32 extend congruently to the gaps 35 here as well. Since the semiconductor legs 27, 28 have a certain flexural elasticity, the individual ceramic plate segments 31 can be moved relative to each other without unacceptably strong forces developing within the structure of the thermoelectric module 13.

As can be seen especially clearly in FIG. 4, the LEG pairs 26 within the thermoelectric module 13 are advantageously arranged regularly, namely, such that a rectangular grid structure is obtained for the metal bridges 29 on the respective side, i.e., on the hot side 18 or on the cold side 19 of the thermoelectric module 13. The ceramic plate segments 31 advantageously also have a rectangular shape in this case.

While specific embodiments of the invention have been shown and described in detail to illustrate the application of the principles of the invention, it will be understood that the invention may be embodied otherwise without departing from such principles.

What is claimed is:

1. A thermoelectric module for converting thermal energy into electric energy, the thermoelectric module comprising:
   a plurality of leg pairs, each leg pair comprising a p-doped semiconductor leg and an n-doped semiconductor leg and metal bridges contacting the p-doped semiconductor leg and the n-doped semiconductor leg such that the p-doped semiconductor leg and the n-doped semiconductor leg are electrically in contact, each of said metal bridges comprising a first metal bridge planar surface and a second metal bridge planar surface, said first metal bridge planar surface being in direct contact with said p-doped semiconductor leg and said n-doped semiconductor leg, one of said metal bridges being located at a spaced location from another one of said metal bridges; and
   an electrically insulating ceramic plate arranged on a hot side of the thermoelectric module or on a cold side of the thermoelectric module, the electrically insulating ceramic plate being in surface contact with the metal bridges associated with the side and being fastened thereto and wherein:
   the ceramic plate is segmented to provide a plurality of ceramic plate segments arranged next to each other, the ceramic plate segments being in flat surface contact with the plurality of metal bridges and being fastened thereto, each of said ceramic plate segments comprising a planar ceramic plate surface, said planar ceramic plate surface of one of said ceramic plate segments extending continuously, without interruption, from one end of one of said ceramic plate segments to another end of another one of said ceramic plate segments, said planar ceramic plate surface comprising a first planar ceramic plate surface portion, a second planar ceramic plate surface portion and a third ceramic plate surface portion, said first planar ceramic plate surface portion being in direct contact with said second metal bridge planar surface of one of said metal bridges, said second planar ceramic plate surface portion being in direct contact with said second metal bridge planar surface of another one of said metal bridges, said third ceramic plate surface portion being located at a spaced location from said one of said metal bridges and said another one of said metal bridges.

2. A thermoelectric module in accordance with claim 1, wherein adjacent ceramic plate segments abut against each other and touch each other along a respective butt joint.

3. A thermoelectric module in accordance with claim 1, wherein a joint is formed between adjacent ceramic plate segments, whereby adjacent ceramic plate segments do not touch each other, wherein said third ceramic plate surface portion is located between said one of said metal bridges and said another one of said metal bridges, said third ceramic plate surface portion being located between said first ceramic plate surface portion and said second ceramic plate surface portion.

4. A thermoelectric module in accordance with claim 3, wherein a respective joint is sealed gas-tightly with a jointing compound, said one of said metal bridges and said another one of said metal bridges defining a gap, said planar ceramic plate surface bridging said gap.

5. A thermoelectric module in accordance with claim 4, further comprising a heat-conducting adhesive fastening the ceramic plate segments to the metal bridge, the heat-conducting adhesive is the jointing compound, wherein said third ceramic plate surface portion does not contact said one of said metal bridges and said another one of said metal bridges.

6. A thermoelectric module in accordance with claim 4, wherein a pourable sealing compound, with which intermediate spaces of adjacent semiconductor legs within the respective thermoelectric module are filled, is the jointing compound.

7. A thermoelectric module in accordance with claim 1, wherein:
adjacent ceramic plate segments abut against each other and touch each other along a respective butt joint or adjacent ceramic plate segments do not touch each other; and
adjacent ceramic plate segments are arranged such that a respective butt joint or respective joint extends congruently to gaps, which are formed on a side between adjacent metal bridges.

8. A thermoelectric module in accordance with claim 1, wherein:
the leg pairs are arranged regularly, such that a rectangular grid structure is obtained on a respective rectangular grid structure side for the metal bridges; and
the ceramic plate segments are rectangular.

9. A thermoelectric module in accordance with claim 1, further comprising:
another segmented ceramic plate wherein the ceramic plate and the another segmented ceramic plate are respectively arranged on the hot side and the cold side, wherein an exhaust system removes exhaust gas from combustion chambers of an engine block with a plurality of combustion chambers, said exhaust system comprising an exhaust pipe connected to the engine block;
a heat exchanger integrated with the exhaust pipe, the heat exchanger comprising the thermoelectric module, the heat exchanger being connected to a heating tube for carrying a heating fluid and a cooling tube for carrying a cooling fluid;
a bracing structure, wherein the tubes and the thermoelectric module are braced in the stacking direction.

10. A thermoelectric module in accordance with claim 1, further comprising:
a jointing compound, each of said ceramic plate segments comprising a bottom ceramic plate segment surface, said jointing compound extending continuously, without interruption, from an end of said bottom ceramic plate segment surface of one of said ceramic plate segments to an end of said bottom ceramic plate segment surface of another one of said ceramic plate segments.

11. A thermoelectric module in accordance with claim 10, wherein each of said ceramic plate segments comprises a lateral surface extending from said bottom ceramic plate segment surface to another planar ceramic plate surface, said jointing compound being in direct contact with said lateral surface of said one of said ceramic plate segments and said lateral surface of said another one of said ceramic plate segments.

12. A thermoelectric module in accordance with claim 11, wherein said lateral surface is perpendicular to said planar ceramic plate surface and said another planar ceramic plate surface.

13. A thermoelectric module in accordance with claim 1, wherein each of said ceramic plate segments forms a rigid structure for supporting one of said metal bridges.

14. A thermoelectric module for converting thermal energy into electric energy, the thermoelectric module comprising:
a plurality of leg pairs, each leg pair comprising a p-doped semiconductor leg and an n-doped semiconductor leg and metal bridges contacting the p-doped semiconductor leg and the n-doped semiconductor leg such that the p-doped semiconductor leg and the n-doped semiconductor leg are electrically in contact, each of said metal bridges comprising a first metal bridge planar surface and a second metal bridge planar surface, said first metal bridge planar surface comprising a first metal bridge planar surface portion and a second metal bridge planar surface portion, said first metal bridge planar surface portion being in direct contact with said p-doped semiconductor leg, said second metal bridge planar surface portion being in direct contact with said n-doped semiconductor leg; and
an electrically insulating ceramic plate arranged on a hot side of the thermoelectric module or on a cold side of the thermoelectric module, the electrically insulating ceramic plate being in surface contact with the metal bridges associated with the side and being fastened thereto, wherein the ceramic plate comprises a plurality of ceramic plate segments arranged next to each other, each of said ceramic plate segments comprising a planar ceramic plate surface extending continuously, without interruption, from one end of one of said ceramic plate segments to another end of another one of said ceramic plate segments, said planar ceramic plate surface comprising a metal bridge non-contact portion, said planar ceramic plate surface of each of said ceramic plate segments being in direct contact with said second metal bridge planar surface of one of said metal bridges and said second metal bridge planar surface of another one of said metal bridges, said one of said metal bridges being located at a spaced location from said another one of said metal bridges, said metal bridge non-contact portion being located at a spaced location from said metal bridges.

15. A thermoelectric module in accordance with claim 14, wherein a joint is formed between adjacent ceramic plate segments, whereby adjacent ceramic plate segments do not touch each other, said planar ceramic plate surface comprising a first metal bridge contact portion and a second metal bridge contact portion, said first metal bridge contact portion being in direct contact with said second metal bridge planar surface of said one of said metal bridges, said second metal bridge contact portion being in direct contact with said second metal bridge planar surface of said another one of said metal bridges.

16. A thermoelectric module in accordance with claim 15, wherein the respective joint is sealed gas-tightly with a jointing compound, said metal bridge non-contact portion being located between said one of said metal bridges and said another one of said metal bridges, said metal bridge non-contact portion being located between said first ceramic plate surface portion and said second ceramic plate surface portion, said one of said metal bridges and said another one of said metal bridges defining a gap, said planar ceramic plate surface bridging said gap.

17. A thermoelectric module in accordance with claim 14, further comprising:

a jointing compound, each of said ceramic plate segments comprising a bottom ceramic plate segment surface, said jointing compound extending continuously, without interruption, from an end of said bottom ceramic plate segment surface of one of said ceramic plate segments to an end of said bottom ceramic plate segment surface of another one of said ceramic plate segments.

18. A thermoelectric module in accordance with claim 17, wherein each of said ceramic plate segments comprises a lateral surface extending from said bottom ceramic plate segment surface to another planar ceramic plate surface, said jointing compound being in direct contact with said lateral surface of said one of said ceramic plate segments and said lateral surface of said another one of said ceramic plate segments.

19. A thermoelectric module in accordance with claim 18, wherein said lateral surface is perpendicular to said planar ceramic plate surface and said another planar ceramic plate surface.

20. A thermoelectric module in accordance with claim 14, wherein each of said ceramic plate segments forms a rigid structure for supporting one of said metal bridges.

\* \* \* \* \*